(12) United States Patent
Endo

(10) Patent No.: US 6,727,763 B2
(45) Date of Patent: Apr. 27, 2004

(54) PLL SYNTHESIZER IN A CELLULAR PHONE

(75) Inventor: Megumi Endo, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/242,790

(22) Filed: Sep. 13, 2002

(65) Prior Publication Data

US 2003/0058054 A1 Mar. 27, 2003

(30) Foreign Application Priority Data

Sep. 14, 2001 (JP) ........................ 2001-279863

(51) Int. Cl.[7] .............................................. H03L 7/107
(52) U.S. Cl. ........................ 331/17; 331/25; 455/260
(58) Field of Search ........................ 331/1 A, 17, 18, 331/25; 455/260, 550

(56) References Cited

U.S. PATENT DOCUMENTS

| | | | |
|---|---|---|---|
| 3,729,688 A | * 4/1973 | Cerny et al. | 331/1 A |
| 5,761,617 A | 6/1998 | Yonekura et al. | |
| 5,767,714 A | 6/1998 | Kotani et al. | |
| 6,583,675 B2 | * 6/2003 | Gomez | 331/17 |

FOREIGN PATENT DOCUMENTS

| | | |
|---|---|---|
| EP | 0 211 594 | 7/1986 |
| EP | 0 669 722 A2 | 2/1995 |
| JP | 9-64733 | 3/1997 |

* cited by examiner

*Primary Examiner*—David Mis
(74) *Attorney, Agent, or Firm*—Whitham, Curtis & Christofferson P.C.

(57) ABSTRACT

A cellular phone has consecutively a receiving slot, an idling slot which is either a waiting slot or a peripheral information receiving slot, and a transmitting slot in a single frame. The PLL synthesizer includes a loop filter block between a charge pump and a voltage controlled oscillator to control the locking time of the PLL synthesizer for switching between the oscillation frequencies. The loop filter block selects a first filter having a largest time constant upon switching from a receiving frequency to a transmitting frequency via an idling slot, an intermediate time constant upon switching from the transmitting frequency to the receiving frequency, and a smallest time constant upon switching from the receiving frequency to the transmitting frequency via the peripheral information receiving frequency.

8 Claims, 6 Drawing Sheets

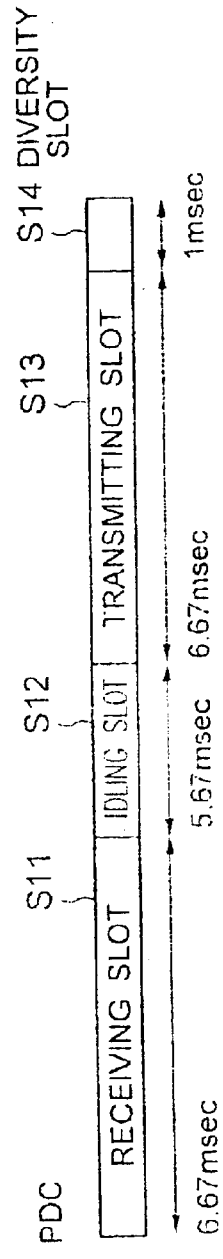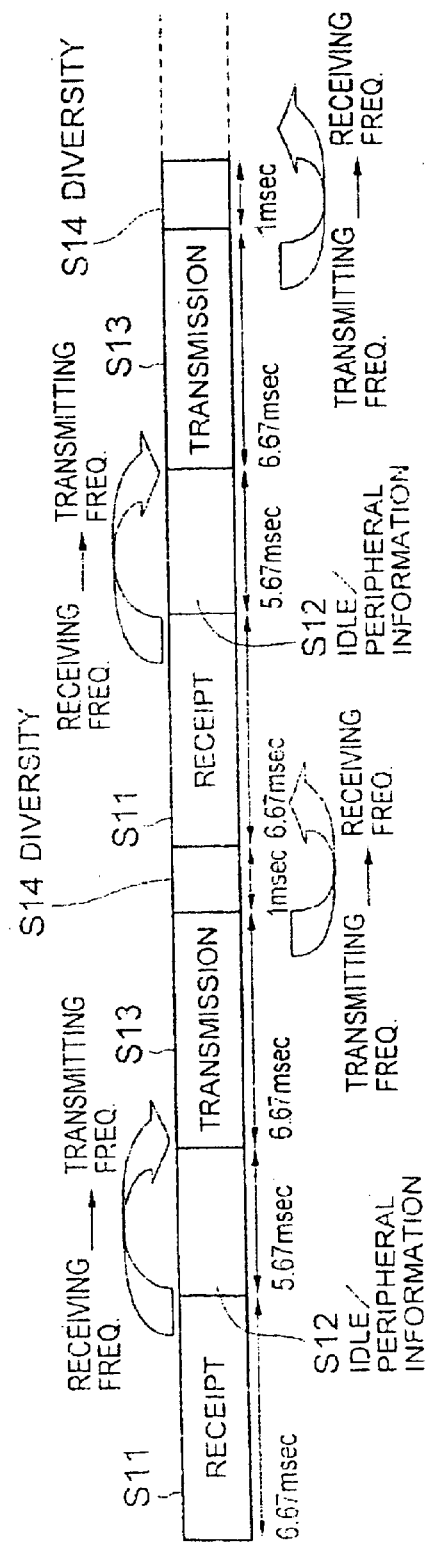
FIG. 2A
FIG. 2B

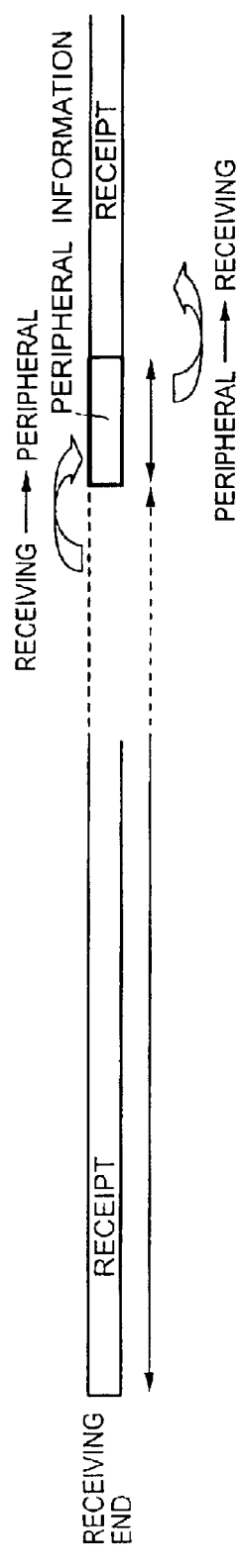
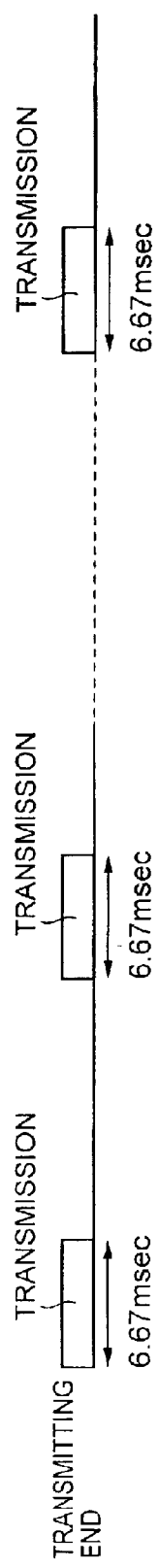
FIG. 3A
FIG. 3B

PLL SYNTHESIZER IN A CELLULAR PHONE

BACKGROUND OF THE INVENTION (a) Field of the Invention

The present invention relates to a PLL (phase locked loop) synthesizer and, more particularly, to a PLL synthesizer which is capable of selecting one of a plurality of locking times in a cellular phone.

(b) Description of the Related Art

PLL circuits are widely used in the fields of, for example, television receivers, satellite communications, and radio communications. The PLL circuit generates a frequency signal in synchrony with a reference signal having a reference frequency, the frequency signal having a frequency of a specified ratio with respect to the reference frequency. For example, in a cellular phone system operating with a time division multiple access (TDMA) scheme, the PLL circuit is used as a PLL synthesizer which generates the frequency of a transmission channel.

FIG. 6 shows a conventional PLL synthesizer, which includes a PLL integrated circuit (PLL-IC) 20, a first loop filter (LPF) 40, a second loop filter (LPF) 45, and a voltage controlled oscillator (VCO) 50. The PLL-IC 20 includes therein a phase comparator 24, a register 23, a divider 22, a prescaler 21, and a charge pump (CP) 25.

An output of the VCO 50 is delivered to outside the PLL synthesizer as well as the prescaler 21 to form a feedback loop. The prescaler 21 has a function of roughly dividing the input frequency with a high speed to assist the dividing operation by the divider 22. The divided-frequency signal 104 output from the divider 22 and the reference frequency signal (Ref_F) 100 are fed to the phase comparator 24. The phase comparator 24 compares phases of both the input signals against each other to deliver a phase comparison result signal which depends on which phase leads or lags with respect to the other. The charge pump 25 receives an output signal from the phase comparator 24 to deliver an output voltage signal to the VCO 50 through the LPF 40 and the loop filter 45. The output frequency of the VCO 50 is controlled by the output voltage signal of the charge pump 25. Upon coincidence of the phase of the divided-frequency signal 104 with the phase of the reference frequency signal 100, the PLL synthesizer is locked, i.e., the oscillation frequency of the PLL synthesizer is fixed at a desired frequency.

The loop filter 45 is provided in order to control the locking time of the PLL synthesizer, i.e., the time interval between the time instant at which the change of the oscillation frequency of the PLL synthesizer is started and the time instant at which the PLL synthesizer is locked to stabilize the oscillation frequency. The time constant of the loop filter 45 is set to conform with the locking time needed in the PLL synthesizer. For example, if the frequency should be switched at a higher speed, then the time constant is set at a lower value, and if the frequency need not be switched at a high speed, then the time constant is set at a larger value to obtain a longer locking time.

For reducing the locking time, the time constant of the loop filter should be reduced. However, a smaller time constant increases the bandwidth of the loop filter and degrades the carrier-to-noise (C/N) ratio of the signal passing therethrough, degrading the characteristics of the radio system having the PLL synthesizer.

If the PLL synthesizer has a configuration such that the output frequency thereof is changed stepwise, the time constant of the loop filter 45 should be set at a value corresponding to the minimum locking time necessary in the changeover for a specified output frequency. However, setting of the locking time at the value corresponding to the minimum locking time means that the minimum locking time is used in the changeover of all the other output frequencies wherein such a minimum locking time is not necessary. This means the PLL synthesizer is used in the state of degraded C/N ratio in all the other output frequencies due to achieving the shorter locking time thus selected. In short, a smaller locking time and better radio characteristics are tradeoffs in the conventional PLL synthesizer.

SUMMARY OF THE INVENTION

In view of the above, it is an object of the present invention to provide a PLL synthesize capable of achieving a required locking time and an excellent C/N ration in the output frequency thereof.

It is another object of the present invention to provide a cellular phone having a plurality of slots in a single frame and achieving an optimum locking time in the switching between the plurality of frequencies used in respective slots in the single frame.

The present invention provides a phase locked loop (PLL) synthesizer including: a phase comparator for comparing a phase of a first frequency signal having a first frequency against a phase of a reference frequency signal; a voltage controlled oscillator (VCO) having an input node receiving a frequency control voltage controlled based on a result of the comparison by the phase comparator, and an output node outputting a second frequency signal having a second frequency controlled based on the frequency control voltage; a frequency divider for receiving the second frequency signal to divide the second frequency and to output the first frequency signal; and a loop filter connected at the input node of the VCO for passing the frequency control signal to the VCO, the loop filter having three or more time constants for a filter function and a selector for selecting one of the time constants.

The present invention also provides cellular phone including the PLL synthesizer as defined in claim 1, wherein the cellular phone has three or more slots in a single frame.

In accordance with the PLL synthesizer of the present invention and the PLL synthesizer in the cellular phone of the present invention, an optimum time constant can be obtained in the PLL synthesizer for achieving an optimum locking time and excellent characteristics of the cellular phone having the PLL synthesizer.

The above and other objects, features and advantages of the present invention will be more apparent from the following description, referring to the accompanying drawings.

BRIEF DESCRIPTION OF THE DRAWINGS

FIG. 2A is a time slot diagram of a cellular phone operating with a PDC scheme, and FIG. 2B is a time chart showing transitions in the cellular phone.

FIGS. 3A and 3B are time charts of the receiving station and the transmitting station in a cellular phone system of a Full Packet scheme.

PREFERRED EMBODIMENTS OF THE INVENTION

Figure 1:
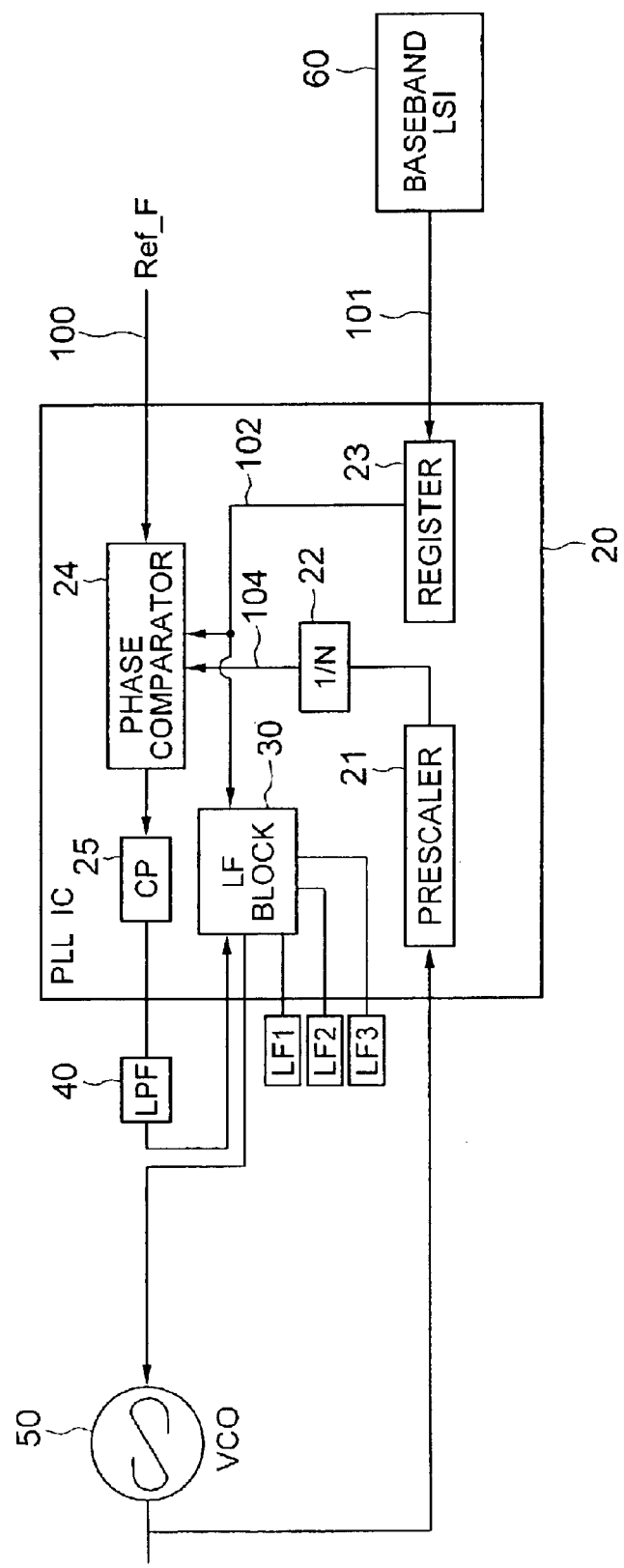
FIG. 1 is a block diagram of a PLL synthesizer according to a first embodiment of the present invention.

Now, the present invention is more specifically described with reference to accompanying drawings, wherein similar constituent elements are designated by similar reference numerals.

Referring to FIG. 1, a PLL synthesizer according to a first embodiment of the present invention includes a PLL IC 20, a LPF (loop filter) 40, and a VCO 50. The PLL IC 20 includes a phase comparator 24, a register 23, a 1/N-divider 22, a prescaler 21, a charge pump (CP) 25, and a loop filter bock (LF block) 30. The PLL IC 20 receives a reference frequency signal Ref_F100 supplied from outside the PLL synthesizer, and serial data 101 supplied from a baseband LSI 60. The PLL synthesizer is controlled to be set at a desired oscillation frequency based on the serial data 101, and oscillates in synchrony with the reference frequency signal Ref_F100.

The baseband LSI 60 delivers the serial data 101, which includes information of the frequency to be locked with in the PLL synthesizer and is stored in the register 23 in the PLL IC 20. The serial data indicates one of a receiving frequency, a transmitting frequency, and a peripheral information receiving frequency, to allow the PLL synthesizer to be locked therewith. The register 23 delivers the stored serial data as a frequency control signal 102 to the phase comparator 24 and the loop filter block 30. The output node of the PLL IC 20 is connected to the input node of the VCO 50 via the LPF 40. An output from the VCO 50 is fed back to the prescaler 21 in the PLL IC 20 and fed outside the PLL synthesizer. The prescaler 21 has a function for variably dividing the input signal at a high speed, and co-operates with the 1/N-divider 22, which delivers a divided-frequency signal 104 having a frequency of 1/N of the input frequency of the prescaler 21 to the phase comparator 25.

The phases of the frequency-divided signal 104 and the reference frequency signal 100 are compared against each other in the phase comparator 24, which delivers a phase comparison signal to the charge pump 25. The phase comparison signal controls the charge pump 25, to raise the output voltage thereof when the phase of the divided-frequency signal 104 lags with respect to the phase of the reference frequency signal 100, and to lower the output voltage of the charge pump 25 when the divided-frequency signal 104 leads with respect to the phase of the reference frequency signal 100.

The output voltage of the charge pump 25 is delivered to the VCO 50 via the LPF 40 and the loop filter block 30. The output voltage of the charge pump 25 controls the output frequency of the VCO 50. When the phase difference between the divided-frequency signal 104 and the reference frequency signal 100 becomes zero, the PLL synthesizer is locked. The loop filter block 30 includes first through third filters LF1, LF2 and LF3, one of which is selected based on a selection control signal.

The PLL synthesizer of the present invention may be used in a cellular phone operating with a time division multiple access (TDMA) communication scheme or a personal digital cellular (PDC) communication scheme, for example. Referring to FIG. 2A, a single frame in the cellular phone of the PDC communication scheme includes therein four slots, i.e., receiving slot S11, idling slot S12, transmitting slot S13 and diversity slot S14 in this order, which have respective time intervals such as depicted in FIG. 2A. The idling slot S12 is used as a slot for waiting for switching between the frequencies or sometimes used as slot for receiving information of a peripheral information receiving channel which allows receipt of an electric field of the peripheral channel.

Referring to FIG. 2B, there is shown a time chart of operation of the cellular phone for switching between the receiving frequency channel and the transmitting frequency channel. When the PLL synthesizer locked with the receiving-frequency channel is to be switched for locking with the transmitting-frequency channel, an idling slot S12 is interposed between the receiving slot S11 and the transmitting slot S12. Since the idling slot S13 has a time interval of 5.67 milliseconds, the switching from the receiving frequency to the transmitting frequency should be completed within a time interval of 5.67 milliseconds. A diversity slot S14 is provided between the transmitting slot S13 and the receiving slot S11. When the PLL synthesizer is eventually to be switched from the transmitting frequency to the receiving frequency, the switching should be completed within a time interval of 1 millisecond, because the diversity slot S14 has a time interval of 1 millisecond.

The idling slot S12 may be used as a slot for receiving a peripheral information channel, as described above. In this operation, the frequency switching in the idling slot S14 include a first switching operation wherein the PLL synthesizer locked with the receiving-frequency channel is switched to be locked with the peripheral information receiving channel, and a second switching operation wherein the PLL synthesizer locked with the peripheral information receiving channel is switched to be locked with the transmitting-frequency channel. The switching operations in this slot S12 should be completed at a high speed because a blank slot such as the idling slot is not disposed for the switching operations.

FIGS. 3A and 3B show operations of a pair of cellular phones, i.e., the cellular phone of a receiving end and the cellular phone of a transmitting end, respectively, wherein both the cellular phones operate in a full-packet scheme, or one of PDC schemes. In this scheme, the receiver in the receiving end operates for receiving packet data in all the slots of a plurality of consecutive frames, as shown in FIG. 3A, whereas the transmitter in the transmitting end operates for transmitting in a single transmitting slot allocated in each single frame, as shown in FIG. 3B. The receiver in the receiving end may sometime receive peripheral information during the successive receiving operations.

The frequency switching in the receiver of the full-packet scheme includes, as one of the PDC schemes, the first switching operation wherein the PLL synthesizer locked with the receiving-frequency channel is switched to be locked with the peripheral-frequency channel and the second switching wherein the PLL synthesizer locked with the peripheral-frequency channel is switched to be locked with the receiving-frequency channel. For maintaining the receiving state as long as possible for achieving an efficient receiving operation for the packet data, the time length for receiving the peripheral information should be reduced, and the frequency switching should be completed at a higher speed.

The modes of the frequency switching and the allowable time lengths (locking times) for the frequency switching as well as the loop filters selected in the loop filter block 30 for the frequency modes are tabulated in the following table 1.

TABLE 1

| Switching Mode | Locking Time | Loop Filter |
| --- | --- | --- |
| Receive→Transmit | 5.67 msec. | LF1 |
| Transmit→Receive | 1 msec. | LF2 |
| Receive→Peripheral→Transmit | High Speed | LF3 |
| Packet →Peripheral→Packet | High Speed | LF3 |

Each loop filter LF1, LF2 and LF3 allows the PLL synthesizer to switch the channel within the allowable locking time tabulated in Table 1, wherein the time constants TC of the loop filters LF1, LF2 and LF3 are as follows:

$TC_{LF1} > TC_{LF2} > TC_{LF3}$.

In terms of the cut-off frequency as the low-pass-filter, the low-pass-filter 40 has a highest cut-off frequency, and the loop filters LF1, LF2 and LF3 have cut-off frequencies decreasing in this order.

Figure 4:
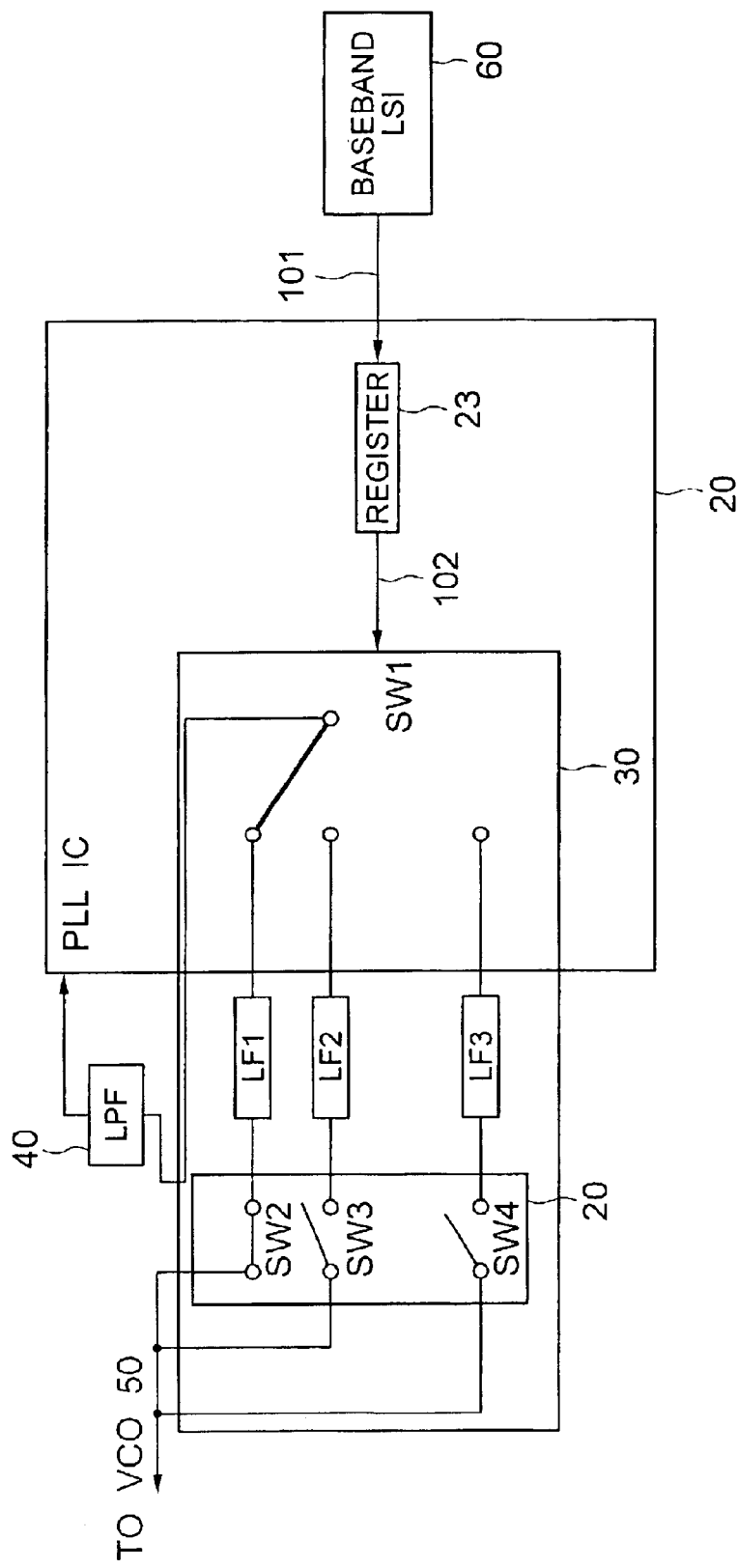
FIG. 4 is a block diagram showing connections of the loop filter block shown in FIG. 1.

Referring to FIG. 4, there are shown connections between the LF block 30 and the PLL IC 20 in the PLL synthesizer of FIG. 1. The LF block 30 includes three filters LF1, LF2 and LF3 which are selected by a switch section of the PLL IC 20, the switch section including switches SW1 to SW4. Each filter includes a serial resistor and a parallel capacitor.

In selection of the mode for switching from the receiving frequency directly to the transmitting frequency, serial data 101 indicating the receiving frequency is delivered from the baseband LSI 160 to the PLL IC 20. The register 23, after receiving the serial data 101, delivers information of the receiving frequency as a frequency control signal 102 to the LF block 30. The LF block 30 then selects one of the filters LF1, LF2 and LF3 based on the frequency control signal 102 received from the register 23. The switching from the receiving frequency to the transmitting frequency is completed within a time interval of 5.67 milliseconds. This time interval allows the filter LF1 having a largest time constant to be used for this switching operation. The largest time constant of the selected filter LF1 allows the PLL synthesizer to have a moderate speed of the switching, to operate with an excellent C/N ratio and to improve the radio characteristics of the PLL synthesizer.

In selection of the mode for switching from the transmitting frequency directly to the receiving frequency, serial data 101 indicating the receiving frequency is delivered from the baseband LSI 60 to the PLL IC 20. This switching operation is completed within a time interval of 1 millisecond by selecting the loop filter LF2 having an intermediate time constant suited for the switching.

In selection of the mode for switching from the receiving frequency to the transmitting frequency via a peripheral information receiving frequency, serial data 101 indicating the peripheral information receiving frequency and the transmitting frequency are consecutively delivered from the baseband LSI 60 to the PLL IC 20. This switching operation should be completed as soon as possible, and thus the loop filter LF3 having a smallest time constant is selected.

In selection of the mode for switching from the receiving frequency to the packet data receiving frequency for full packet data via the peripheral information receiving frequency, serial data 101 indicating the peripheral information receiving frequency and the receiving frequency are consecutively delivered from the baseband LSI 60 to the PLL IC 20. In the full packet scheme, the time length for receiving the peripheral information should be as short as possible for achieving a longer time length for receiving the packet data. The loop filter block 30 switches to select the loop filter LF3. By using the loop filter LF3 having a smallest time constant, the PLL synthesizer has a smallest locking time.

Figure 5:
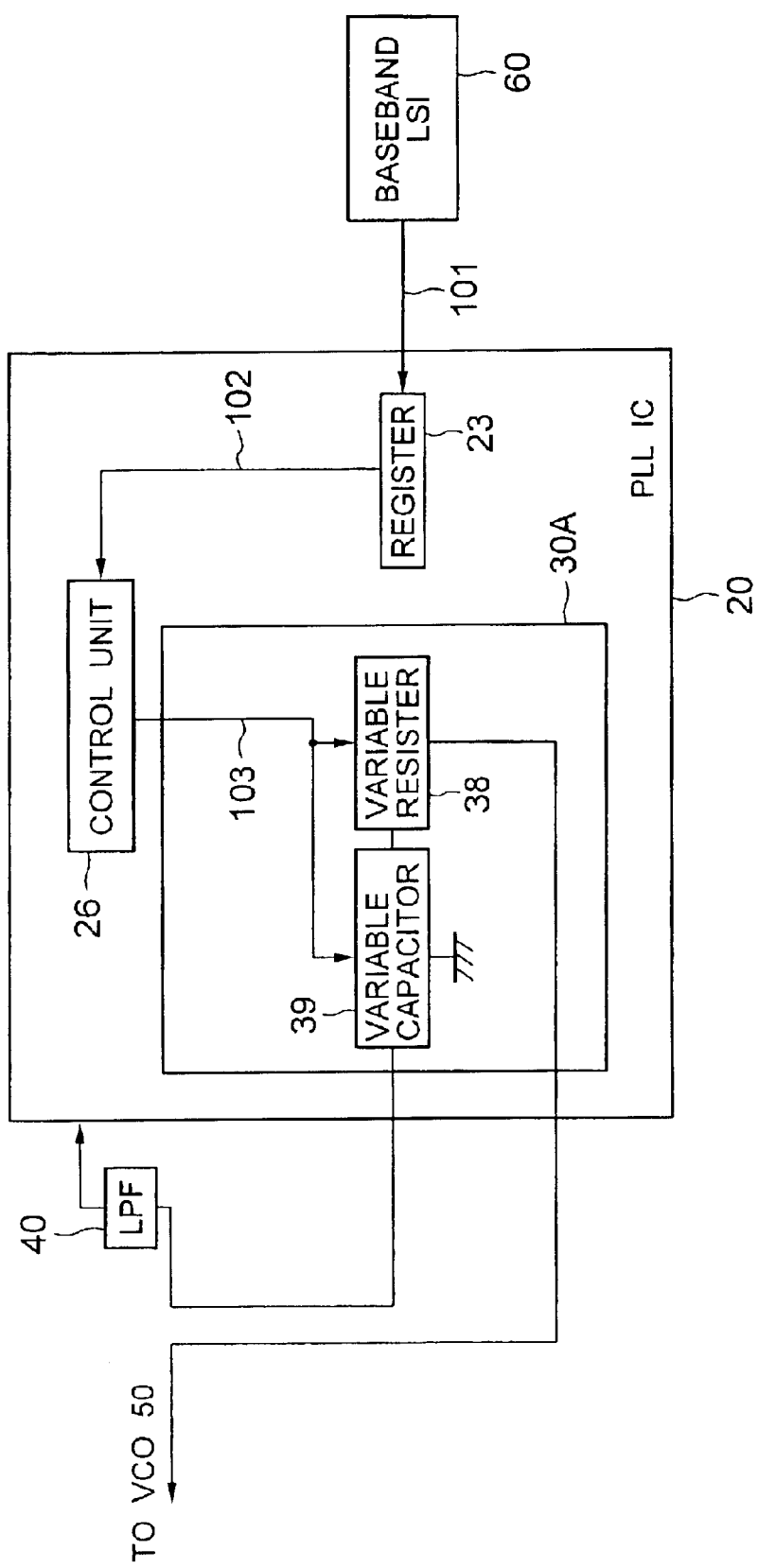
FIG. 5 is a block diagram showing, similarly to FIG. 4, a loop filter block in a PLL synthesizer according to a second embodiment of the present invention.
Figure 6:
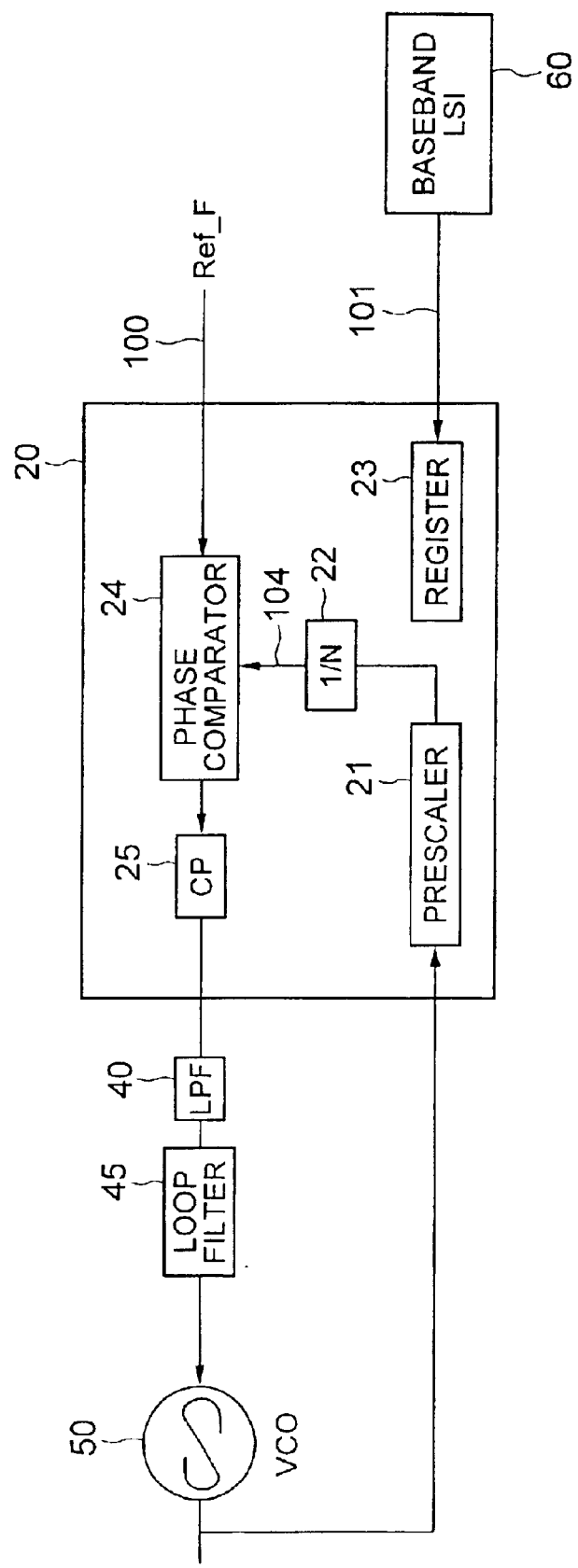
FIG. 6 is a block diagram of a conventional PLL synthesizer.

Referring to FIG. 5 showing a part of a PLL synthesizer according to a second embodiment of the present invention, similarly to FIG. 4, the PLL synthesizer of the present embodiment is similar to the PLL synthesizer of the first embodiment except for the provision of a control unit 26 in the PLL IC 20 in the present embodiment. The control unit 26 receives data from the register 23 to control the resistance of a variable resistor 38 and the capacitance of a variable capacitor 39 in an RC filter, instead of provision of a plurality of loop filters LF1, LF2 and LF3 in the first embodiment.

The variable resistor 38 may have a plurality of fixed resistors and associated switches for connecting a selected number of the fixed resistors in parallel to obtain a desired resistance, whereas the variable capacitor 39 may have a plurality of fixed capacitors and associated switches for connecting a selected number of the fixed capacitors in parallel to obtain a desired capacitance.

The control unit 26 stores information of a plurality of patterns of time constant for setting the locking times in switching the frequency of the PLL synthesizer from the receiving frequency to the transmitting frequency, from the transmitting frequency to the receiving frequency, from the receiving frequency to the peripheral information receiving frequency, from the peripheral information receiving frequency to the receiving frequency, and the peripheral information receiving frequency to the transmitting frequency. When a frequency control signal 102 is delivered from the register 23, the control unit 26 selects one of the patterns stored therein based on the frequency control signal 102 indicating the locking time to output the selected pattern as a time constant control signal 103, thereby controlling the resistance of the variable resistor 38 and the capacitance of the variable capacitor 39. Thus, the locking time in accordance with the mode for the frequency switching can be obtained for the PLL synthesizer.

In the first embodiment, a desired number of loop filters should be provided in the loop filter block, whereas a desired number of combinations of the fixed resistor and the fixed capacitor is sufficient in the second embodiment. Thus, the second embodiment achieves a simple structure for the PLL synthesizer.

Since the above embodiments are described only for examples, the present invention is not limited to the above embodiments and various modifications or alterations can be easily made therefrom by those skilled in the art without departing from the scope of the present invention.

For example, the configurations of the variable resistor and the variable capacitor may be modified from the above embodiment such that the fixed resistors and/or the fixed capacitors may be connected in combination of series and parallel connections. In addition, the present invention can be applied to any PLL synthesizer other than the PLL synthesizer of the TDMA scheme.

What is claimed is:

1. A cellular phone having a plurality of time slots in a single frame each utilizing a different frequency and a phase locked loop (PLL) synthesizer comprising:
   a phase comparator for comparing a phase of a first frequency signal having a first frequency against a phase of a reference frequency signal;
   a voltage controlled oscillator (VCO) having an input node receiving a frequency control voltage controlled based on a result of the comparison by said phase comparator, and an output node outputting a second frequency signal having a second frequency controlled based on said frequency control voltage;

a frequency divider for receiving said second frequency signal to divide said second frequency and to output said first frequency signal; and a loop filter connected at said input node of said VCO for passing said frequency control signal to said VCO, said loop filter having providing different time constants for a filter function and a means for applying one of said time constants in accordance with particular transitions between said plurality of time slots in said single frame in accordance with a required locking time to minimize bandwidth of said loop filter.

2. The PLL synthesizer as defined in claim 1, wherein said loop filter includes an RC low-pass-filter having a variable resistor and a variable capacitor.

3. The PLL synthesizer as defined in claim 1, wherein said loop filter includes three or more low-pass-filters having respective said time constants, and said selector selects one of said low-pass-filters.

4. A cellular phone comprising the PLL synthesizer as defined in claim 1, wherein said cellular phone has three or more time slots in a single frame.

5. The cellular phone as defined in claim 4, wherein said single frame includes a receiving slot, an idling slot and a receiving slot in this order.

6. The cellular phone as defined in claim 5, wherein said idling slot is either a waiting slot or a peripheral information receiving slot for receiving information of an electric filed of a peripheral channel.

7. The cellular phone as defined in claim 5, wherein said single frame further includes a diversity slot succeeding said transmitting slot.

8. The cellular phone as defined in claim 6, wherein said time constants include first through third time constants which reduce in magnitude in this order, and wherein said means for applying:

switching from said receiving slot to said transmitting slot via said waiting slot;

switching from said transmitting slot to said receiving slot; and switching from said receiving slot to said peripheral information receiving slot and upon switching from said peripheral information receiving slot to said transmitting slot in accordance with a required locking time to minimize bandwidth of said loop filter.

* * * * *